United States Patent
Chen

(10) Patent No.: US 8,531,248 B2
(45) Date of Patent: Sep. 10, 2013

(54) VDD-INDEPENDENT OSCILLATOR INSENSITIVE TO PROCESS VARIATION

(75) Inventor: Yi-Tzu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 415 days.

(21) Appl. No.: 12/617,009

(22) Filed: Nov. 12, 2009

(65) Prior Publication Data

US 2010/0201454 A1    Aug. 12, 2010

Related U.S. Application Data

(60) Provisional application No. 61/151,031, filed on Feb. 9, 2009.

(51) Int. Cl.
*H03K 3/26* (2006.01)
*H03K 3/02* (2006.01)

(52) U.S. Cl.
USPC ........... 331/111; 331/70; 331/108 A; 331/143

(58) Field of Classification Search
USPC ................. 331/70, 108 A, 111, 143
See application file for complete search history.

(56) References Cited

U.S. PATENT DOCUMENTS

| | | | | |
|---|---|---|---|---|
| 3,921,101 A | * | 11/1975 | McCoy et al. | 331/108 D |
| 4,115,748 A | * | 9/1978 | Kubo et al. | 331/111 |
| 4,982,169 A | * | 1/1991 | Wyman | 331/111 |
| 5,352,934 A | | 10/1994 | Khan | |
| 5,592,129 A | * | 1/1997 | Fried et al. | 331/111 |
| 6,163,195 A | * | 12/2000 | Jefferson | 327/262 |
| 7,443,260 B2 | * | 10/2008 | Saether | 331/185 |
| 7,557,665 B2 | * | 7/2009 | Chung et al. | 331/66 |
| 7,733,191 B2 | * | 6/2010 | Olmos et al. | 331/111 |
| 7,859,322 B2 | * | 12/2010 | Takeuchi | 327/538 |
| 2005/0258911 A1 | * | 11/2005 | Higuchi et al. | 331/57 |
| 2008/0100389 A1 | * | 5/2008 | Wu et al. | 331/111 |
| 2008/0290955 A1 | * | 11/2008 | Fort et al. | 331/57 |
| 2009/0033381 A1 | * | 2/2009 | Lee et al. | 327/156 |
| 2009/0058542 A1 | * | 3/2009 | Ariyama | 331/57 |

* cited by examiner

*Primary Examiner* — Arnold Kinkead
*Assistant Examiner* — Richard Tan
(74) *Attorney, Agent, or Firm* — Slater & Matsil, L.L.P.

(57) ABSTRACT

An oscillator includes a positive power supply node for providing a positive power supply voltage; a capacitor; and a constant current source providing a first constant current and coupled to the positive power supply node. The first constant current is independent from the positive power supply node. The oscillator also includes a charging current source configured to provide a second constant current to charge the capacitor, wherein the second constant current mirrors the first constant current. The oscillator further includes a constant current source inverter having a third constant current mirroring the first constant current. The constant current source inverter is configured to control the oscillator to transition state at a constant state transition voltage.

16 Claims, 4 Drawing Sheets

VDD-INDEPENDENT OSCILLATOR INSENSITIVE TO PROCESS VARIATION

This application claims the benefit of U.S. Provisional Application No. 61/151,031 filed on Feb. 9, 2009, entitled "VDD-Independent Oscillator Insensitive to Process Variation," which application is hereby incorporated herein by reference.

TECHNICAL FIELD

This invention relates generally to integrated circuit design, and more particularly, to VDD-independent oscillators that are insensitive to process variations.

BACKGROUND

Oscillators are commonly used in applications such as refresh clock sources for dynamic random access memories (DRAM), watch-dog timer clock sources, time monitors, and the like. It is desirable that the oscillators provide stable frequencies under a wide range of working voltages, or in other words, independent from the power supply voltages.

There are various methods for providing the VDD-independent oscillators. For example, FIG. 1 illustrates a block diagram of a conventional VDD-independent oscillator. A power supply voltage VDDext (external VDD) is provided to a voltage down converter (VDC), which generates an internal voltage VDDint. The internal voltage VDDint is then provided to a ring oscillator, which then generates an oscillating signal OCS. Although the internal voltage VDDint is relative stable, it may still have about 10 mV to about 50 mV variation depending on the design of the VDC. Such variation also affects the accuracy of the frequency of the ring oscillator. In addition, even if internal voltage VDDint is a constant voltage, the ring oscillator still suffers from process variations, such problem cannot be solved by the constant VDDint. A further problem is that due to the use of the VDC, the chip area usage and the current consumption of the respective oscillator increase.

U.S. Pat. No. 5,352,934 provides a VDD-independent oscillator circuit, as is shown in FIG. 2, including a bandgap reference generator and a comparator. However, the circuit has a complicated design from using many devices. The chip-area usage and current consumption are thus high. In addition, since the bandgap reference generator uses bipolar junction transistors, its performance will be adversely affected when the oscillator is operated under sub-1V Vdd voltages. What is needed, therefore, is an oscillator overcoming the above-described shortcomings in the prior art.

SUMMARY OF THE INVENTION

In accordance with one aspect of the present invention, an oscillator includes a positive power supply node for providing a positive power supply voltage; a capacitor; and a constant current source providing a first constant current and coupled to the positive power supply node. The first constant current is independent from the positive power supply node. The oscillator also includes a charging current source configured to provide a second constant current to charge the capacitor, wherein the second constant current mirrors the first constant current. The oscillator further includes a constant current source inverter having a third constant current mirroring the first constant current. The constant current source inverter is configured to control the oscillator to a transition state at a constant state transition voltage.

In accordance with another aspect of the present invention, an oscillator includes a positive power supply node; a constant current source coupled to the positive power supply node, wherein the constant current source is configured to provide a first constant current independent from a variation in the positive power supply node; a capacitor charging node; and a capacitor coupled to the capacitor charging node. A charging current source is configured to provide a second constant current to charge the capacitor, wherein the second constant current is independent from the variation in the positive power supply node. A constant current source inverter includes a PMOS transistor and an NMOS transistor. The oscillator is configured to provide a third constant current flowing through a source-drain path of the PMOS transistor and independent from the variation in the positive power supply node. The NMOS transistor has a gate connected to the capacitor charging node.

In accordance with yet another aspect of the present invention, an oscillator includes an output node; a positive power supply node; and a constant current source coupled to the positive power supply node. The constant current source is configured to provide a first constant current independent from a positive supply voltage at the positive power supply node. The constant current source includes a first PMOS transistor including a first source-drain path carrying the first constant current. The oscillator further includes a second PMOS transistor and a third PMOS transistor, wherein gates of the first PMOS transistor, the second PMOS transistor, and the third PMOS transistor are interconnected. The oscillator further includes a capacitor charging node coupled to a drain of the second PMOS transistor; a capacitor coupled to the capacitor charging node; a discharging transistor coupled between the capacitor charging node and a ground; and a first NMOS transistor including a gate coupled to the capacitor charging node, and a drain connected to a drain of the third PMOS transistor and coupled to the output node.

The advantageous features of the present invention include reduced chip area usage and highly stable output frequency at the output of the oscillator. Further, the oscillator is free from both power supply voltage variation and process variation.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel oscillator substantially free from voltage and process variations is presented. The variations and the operation of the embodiment are then discussed. Throughout the various views and illustrative embodiments of the present invention, like reference numbers are used to designate like elements.

Figure 1:
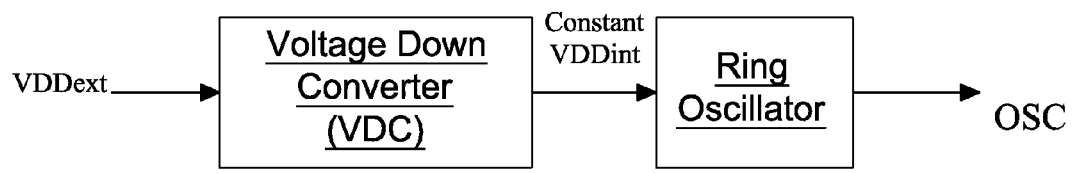
FIG. 1 illustrates a block diagram of a first conventional oscillator.
Figure 2:
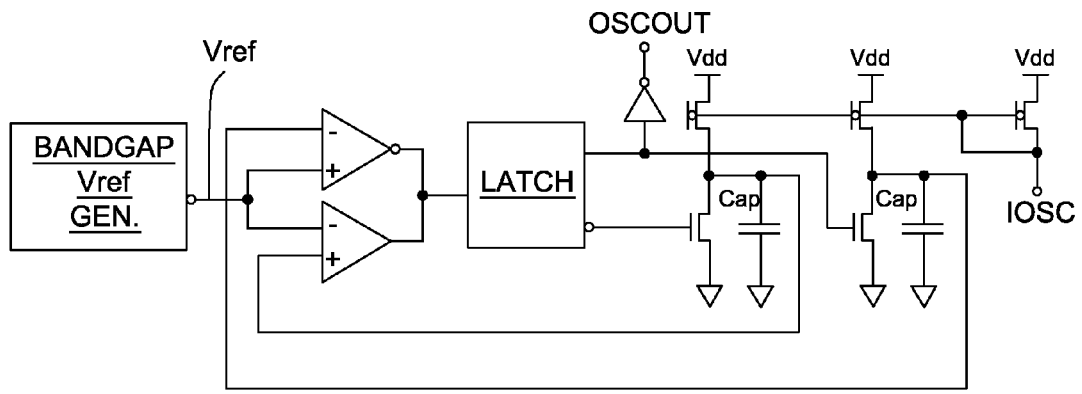
FIG. 2 illustrates a circuit diagram of a second conventional oscillator.
Figure 3:
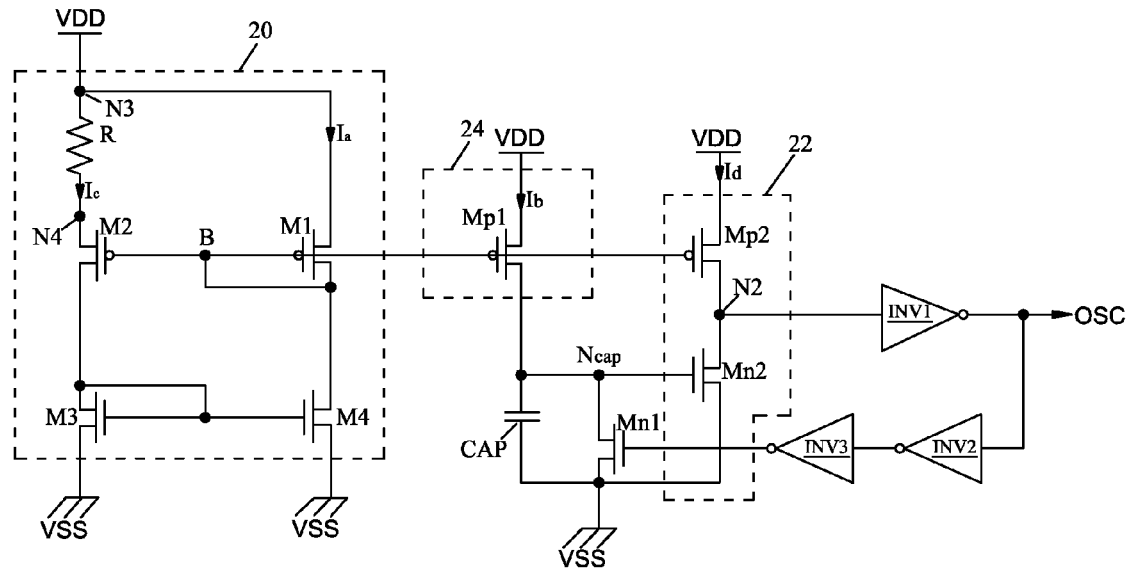
FIG. 3 illustrates a VDD-independent oscillator insensitive to process variations.

FIG. 3 illustrates an oscillator embodiment, which includes constant current source 20, constant current source inverter 22, charging capacitor CAP, and charging current source 24. Constant current source 20 includes PMOS transistors M1 and M2 having their gates interconnected, as indicated by node B that has voltage Vb. Further, the drain of transistor M1 is connected to the gates of PMOS transistors M1 and M2. Further, constant current source 20 includes NMOS transistors M3 and M4 having their gates interconnected. The drain of transistor M3 is connected to the gates of NMOS transistors M3 and M4. It is noted that currents Ic and Ia, which flow through the source-drain paths of PMOS transistors M1 and M2, respectively, mirror each other. Throughout the description, the term "source-drain path" refers to the path connecting the source and drain of a transistor. Resistor R (whose resistance is also denoted as R) may be used to regulate current Ic, and regulate current Ia also. It is realized that currents Ia and Ic are independent from the power supply voltage VDD. For example, assuming the gate width-to-length ratio of transistor M1 is W1/L1, and the gate width-to-length ratio of transistor M2 is W2/L2, and further assuming W2/L2 is equal to 4*(W1/L1), current Ia may be expressed as $1/(R^2 * 2\mu_p C_{ox} *(W1/L1))$, wherein R is the resistance of resistor R, and $\mu_p$ is the hole mobility, and $C_{ox}$ is insulator capacitance. Therefore, current Ia is independent from voltage VDD, and is substantially free from the variation of voltage VDD. Even if the ratio of (W2/L2) to (W1/L1) is different, current Ia is still independent from voltage VDD, and immune from the variation in power supply voltage VDD.

Since the gate B of transistor M1 is connected to the gate of PMOS transistor Mp1, current Ia is mirrored to current Ib, which flows through the source-drain path of PMOS transistor Mp1. Accordingly, current Ib is proportional to current Ia. If PMOS transistors Mp1 and M1 have a same gate width-to-length ratio, current Ib may even be equal to current Ia. Current Ib is used to charge charging capacitor CAP, and hence PMOS transistor Mp1 is a part of charging current source 24. Accordingly, charging capacitor CAP is charged by current Ib that is independent from power supply voltage VDD, and hence is free from variations in power supply voltage VDD.

Constant current source inverter 22 includes PMOS transistor Mp2 and NMOS transistor Mn2. Since gate B of transistor M1 is connected to the gate of PMOS transistor Mp2, current Ia is mirrored to current Id, which flows through the source-drain path of PMOS transistor Mp2. Accordingly, current Id is also proportional to current Ia. If PMOS transistors Mp2 and M1 have a same gate width-to-length ratio, current Id may even be equal to current Ia. PMOS transistor Mp2 acts as a constant current that is independent from power supply voltage VDD, and with the constant current load being free from the variations in power supply voltage VDD. Accordingly, the state transition (trigger) voltage Vcap at node Ncap, at which the state of transistor Mn2 transitions from "off" to "on," (please refer to FIG. 7) is also a constant voltage independent from power supply voltage VDD. State transition voltage Vcap may be expressed as (Vth+ΔV), wherein Vth is the threshold voltage of transistor Mn2, while ΔV is a positive value independent from power supply voltage VDD and the variations in voltage VDD.

The oscillator as shown in FIG. 3 also includes a control circuit for controlling the charging and discharging of capacitor CAP. FIG. 3 illustrates an exemplary control circuit, which includes NMOS transistor Mn1 that is also a discharging transistor for discharging charges in charging capacitor CAP to voltage VSS (or ground). In an initial stage of the charging process, a low voltage (which is substantially equal to the output voltage Vosc at output node OSC) is provided to the gate of MOS transistor Mn1, and thus MOS transistor Mn1 is turned off, and no current flows through MOS transistor Mn1. With the proceeding of the charging of capacitor CAP, the voltage at node Ncap increases. When the voltage at node Ncap reaches state transition voltage Vcap, transistor Mn2 is turned on, and the voltage at node N2, which is the drain of NMOS transistor Mn2, is turned to logic low. Inverter INV1 flips, and output voltage Vosc at node OSC becomes high. Also, inverters INV2 and INV3 flip. Since the voltage at the gate of MOS transistor Mn1 equals Vosc, MOS transistor Mn1 is turned on. Charging capacitor CAP is thus discharged through MOS transistor Mn1 to VSS, and the voltage at node Ncap decreases. When the voltage at node Ncap is low enough, MOS transistor Mn1 is turned off, and another cycle is started to charging capacitor CAP, during which the output at output voltage Vosc at node OSC is low. Accordingly, output voltage Vosc oscillates between high and low voltages.

The maximum voltage at node Ncap is the state transition voltage Vcap (refer to FIG. 7), which occurs immediately before the charges stored in charging capacitor CAP (whose capacitance is C) are discharged. Since charging capacitor CAP is charged by constant current Ib, the charging time Tosc (also refer to FIG. 7) of charging capacitor CAP may be expressed as:

$$Tosc = (Vcap/Ib) * C \qquad [\text{Eq. 1}]$$

In the above equation, state transition voltage Vcap (which equals Vth+ΔV) is a constant that is VDD independent. Current Ib is VDD independent, and capacitance C of charging capacitor CAP is also VDD independent. Accordingly, charging time Tosc (also refer to FIG. 7) is VDD independent. This means that the oscillation frequency of the oscillator as shown in FIG. 3 is also VDD independent.

Figure 4:
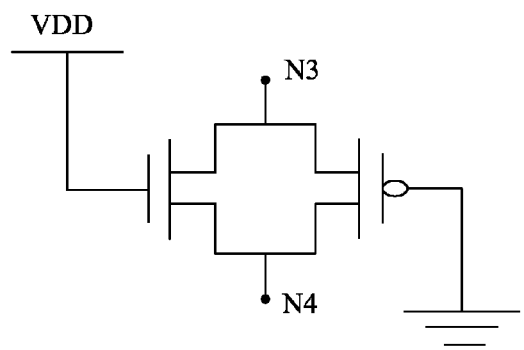
FIG. 4 illustrates a resistor used in the VDD-independent oscillator, wherein the resistor is formed of two MOS transistors.

It is realized that the oscillator as shown in FIG. 3 may have other variations. For example, the resistor R may have the form as shown in FIG. 4, with two transistors having their source/drain regions interconnected, and their gates connected to power supply VDD and VSS or ground. Nodes N3 and N4 may be connected to the nodes N3 and N4 in FIG. 3, respectively, so that the resistor as shown in FIG. 4 may replace the resistor R in FIG. 3.

Figure 5:
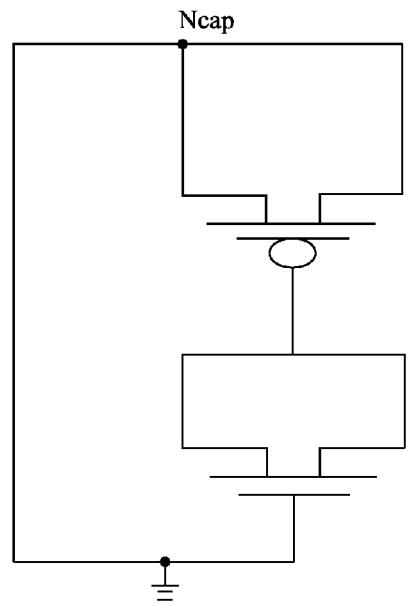
FIG. 5 illustrates a capacitor used in the VDD-independent oscillator, wherein the capacitor is formed of a PMOS transistor and an NMOS transistor.

The charging capacitor CAP as shown in FIG. 3 may also be replaced using one or more transistors, with each of the transistors having a source and a drain interconnected to act as one of the capacitor plates, and the gate acting as the other capacitor plate. In the exemplary embodiment as shown in FIG. 5, the capacitor is formed of an NMOS capacitor and a PMOS capacitor connected in parallel.

The oscillator as shown in FIG. 3 may be substantially free from process variations. It is realized that due to process variations, some transistors may have higher drive currents than designed, and hence are referred to as fast transistors. The corresponding process corner is referred to as a fast-fast corner. Some other transistors may have lower drive currents than designed, and hence are referred to as slow transistors.

The corresponding process corner is referred to as a slow-slow corner. In the embodiments of the present invention, the process variations may cancel each other out resulting in a substantially constant charging time and a constant oscillation frequency. For example, at the fast-fast process corner, at which both PMOS and NMOS transistors are fast, the state transition voltage Vcap as in Equation 1 decreases due to the lower threshold voltage of transistor Mn2. On the other hand, current Ib increases due to the increase in current Ia, which is caused by higher drive currents of transistors M1, M2, M3 and M4. Accordingly, (Vcap/Ib) in Equation 1 decreases. However, when charging capacitor CAP is formed of transistors, for example, as shown in FIG. 5, capacitance C of charging capacitor CAP increases due to the reduction of the equivalent gate oxide thickness. Accordingly, in Equation 1, the decrease in (Vcap/Ib) at least partially cancels the increase in capacitance C, and hence the charging time Tosc at the fast-fast corner is substantially close to a typical-typical corner, which is the process corner as designed.

Conversely, at the slow-slow process corner, state transition voltage Vcap, as in Equation 1, increases due to the higher threshold voltage of transistor Mn2. On the other hand, current Ib decreases due to lower drive currents of transistors M1, M2, M3, and M4. Accordingly, (Vcap/Ib) increases. However, when charging capacitor CAP is formed of transistors, for example, as shown in FIG. 5, capacitance C decreases. Accordingly, referring to Equation 1, the increase in (Vcap/Ib) at least partially cancels the decrease in capacitance C, and hence the Tosc at the slow-slow corner is substantially close to the typical-typical corner. Accordingly, the oscillator circuit as shown in FIG. 3 is substantially free from process variations.

Figure 6:
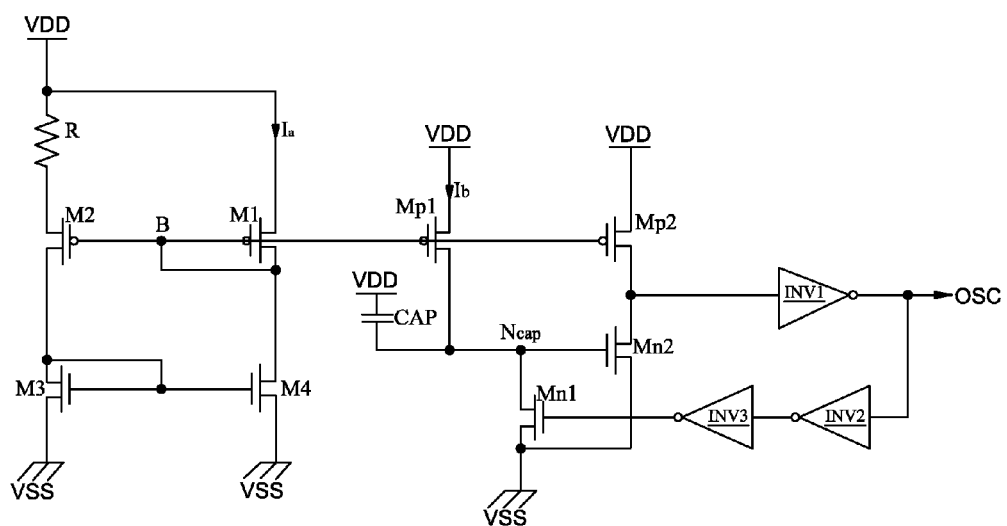
FIG. 6 illustrates an alternative embodiment.

FIG. 6 illustrates an alternative embodiment, wherein charging capacitor CAP is coupled between power supply voltage VDD and node Ncap, instead of between node Ncap and power supply node VSS. The mechanism of the circuit as shown in FIG. 6 is essentially the same as shown in FIG. 3, and hence is not discussed herein. The oscillator as shown in FIG. 6 is also VDD-independent, and may be free from process variations.

Figure 7:
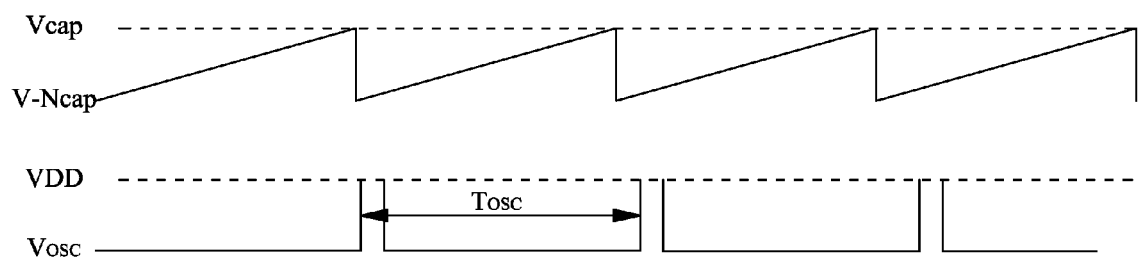
FIG. 7 schematically illustrates an output signal generated by the circuit as shown in FIG. 3.

FIG. 7 schematically illustrates the voltage at node Ncap (denoted as V-Ncap) and state transition voltage Vcap at which the discharging occurs. Further, the output voltage Vosc at node OSC is also illustrated. Clearly, with a constant Tosc that is substantially free from process and voltage variations, the frequency of the output voltage Vosc is also free from process and voltage variations.

The embodiments of the present invention have excellent experiment and simulation results. The simulation results have revealed that when power supply voltage changes from 0.9V to 1.3V, the variation in the oscillating frequency is less than about 2 percent, with the typical variation being less than about 1 percent, and hence the oscillation frequency has an excellent VDD-independency. On the other hand, between the fast-fast corner and the slow-slow corner, the variation in oscillating frequency is only 8 percent or less. Additional advantageous features of the embodiments are that the oscillator circuit is simple and the chip-area usage and power consumption are low.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An oscillator comprising:
a positive power supply node for providing a positive power supply voltage;
a constant current source providing a first constant current and coupled to the positive power supply node, wherein the first constant current is independent from a variation in the positive power supply voltage;
a capacitor;
a charging current source configured to provide a second constant current to charge the capacitor by reducing the voltage across the capacitor independent of variations in the positive power supply node voltage, wherein the second constant current mirrors the first constant current;
a constant current source inverter having a third constant current mirroring the first constant current, wherein the constant current source inverter is configured to control the oscillator to a transition state at a constant state transition voltage, and wherein the constant current source inverter comprises a first NMOS transistor, with the third constant current flowing through a source-drain path of the first NMOS transistor;
wherein the capacitor is coupled directly between the positive power supply node and a gate of the first NMOS transistor and is configured to, at a predetermined voltage level, turn on the first NMOS transistor and set the constant current source inverter to an on state and generate an oscillating signal with a period independent of variations in the positive power supply node voltage.

2. The oscillator of claim 1, wherein the oscillator further comprises a second NMOS transistor having a drain connected to a gate of the first NMOS transistor, wherein the second NMOS transistor is configured to discharge the capacitor at an "on" state.

3. The oscillator of claim 2, wherein the constant current source inverter comprises a PMOS transistor with the third constant current flowing through a source-drain path of the PMOS transistor.

4. The oscillator of claim 1, wherein each of the constant current source, the charging current source, and the constant current source inverter comprises a MOS transistor having a gate interconnected to each other.

5. The oscillator of claim 1, wherein the capacitor comprises a MOS capacitor comprising a source and a drain interconnected to act as a first capacitor plate, and a gate acting as a second capacitor plate.

6. The oscillator of claim 1, wherein the constant current source comprises:
a first PMOS transistor comprising a first source and a first gate connected to a first drain;
a second PMOS transistor comprising a second gate connected to the first gate and a second drain;

a first NMOS transistor comprising a third gate and a third drain connected to the second drain and the third gate; and a second NMOS transistor comprising a fourth gate connected to the third gate and a fourth drain connected to the first drain.

7. An oscillator comprising:
a positive power supply node configured to provide a positive power supply voltage;
a constant current source coupled to the positive power supply node, wherein the constant current source is configured to provide a first constant current independent from a variation in the positive power supply voltage;
a capacitor charging node;
a capacitor directly connected to the capacitor charging node and connected directly to the positive power supply node;
a charging current source configured to provide a second constant current to charge the capacitor, wherein the second constant current is independent from the variation in the positive power supply voltage; and
a constant current source inverter comprising:
    a first PMOS transistor; and
    a first NMOS transistor, wherein the oscillator is configured to provide a third constant current flowing through a source-drain path of the first PMOS transistor and independent from the variation in the positive power supply voltage, and wherein the first NMOS transistor comprises a gate directly connected to the capacitor charging node, wherein the capacitor is configured to, at a predetermined voltage level, turn on the first NMOS transistor to set the constant current source inverter to an on state and generate an oscillating signal with a period independent of variations in the positive power supply node voltage.

8. The oscillator of claim 7, wherein the constant current source comprises a second PMOS transistor having a first source-drain path carrying the first constant current, the charging current source comprises a third PMOS transistor having a second source-drain path carrying the second constant current, and wherein gates of the first PMOS transistor, the second PMOS transistor, and the third PMOS transistor are interconnected.

9. The oscillator of claim 7 further comprising a discharging transistor having a source-drain path coupled between the capacitor charging node and a ground.

10. The oscillator of claim 9 further comprising a control circuit comprising:
    two inverters connected in serial; and
    an output of the oscillator at an output of one of the two inverters, wherein a gate of the discharging transistor is connected to an output of an additional one of the two inverters.

11. The oscillator of claim 7, wherein the gate of the first NMOS transistor is directly connected to the capacitor charging node, with no additional transistors and inverters therebetween.

12. An oscillator comprising:
an output node;
a positive power supply node;
a constant current source coupled to the positive power supply node, wherein the constant current source is configured to provide a first constant current independent from a positive supply voltage at the positive power supply node, and wherein the constant current source comprises a first PMOS transistor comprising a first source-drain path carrying the first constant current;
a second PMOS transistor;
a third PMOS transistor, wherein gates of the first PMOS transistor, the second PMOS transistor, and the third PMOS transistor are interconnected;
a capacitor charging node directly connected to a drain of the second PMOS transistor;
a capacitor directly connected to the capacitor charging node and connected directly to the positive power supply node;
a discharging transistor coupled between the capacitor charging node and a ground; and
a first NMOS transistor comprising a gate coupled to the capacitor charging node and a drain connected to a drain of the third PMOS transistor and coupled to the output node, wherein the discharging transistor and the first NMOS transistor are different transistors and wherein the capacitor is configured to, at a predetermined voltage level, turn on the first NMOS transistor and generate an oscillating signal at the output node with a period independent of variations in the positive power supply node voltage.

13. The oscillator of claim 12, wherein the capacitor charging node, the drain of the discharging transistor, and the gate of the first NMOS transistor are connected to each other.

14. The oscillator of claim 12, wherein a gate of the discharging transistor is coupled to the output node through an inverter.

15. The oscillator of claim 12, wherein the constant current source comprises;
    a fourth PMOS transistor comprising a second gate connected to a first gate of the first PMOS transistor and a second drain;
    a second NMOS transistor comprising a third gate and a third drain connected to the second drain and the third gate; and
    a third NMOS transistor comprising a fourth gate connected to the third gate and a fourth drain connected to the first drain.

16. The oscillator of claim 12, wherein the constant current source further comprises a resistor serially coupled with a source of a fourth PMOS transistor.

* * * * *